United States Patent
Behrends et al.

(10) Patent No.: US 7,215,154 B2
(45) Date of Patent: May 8, 2007

(54) MASKABLE DYNAMIC LOGIC

(75) Inventors: Derick Gardner Behrends, Rochester, MN (US); Ryan Charles Kivimagi, Chatfield, MN (US); Chihhung Liao, Fremont, CA (US)

(73) Assignee: International Business Machines Corporation, Armonk, NY (US)

( * ) Notice: Subject to any disclaimer, the term of this patent is extended or adjusted under 35 U.S.C. 154(b) by 109 days.

(21) Appl. No.: 11/186,608

(22) Filed: Jul. 21, 2005

(65) Prior Publication Data
US 2007/0018690 A1    Jan. 25, 2007

(51) Int. Cl.
*H03K 19/096* (2006.01)
(52) U.S. Cl. .......................................... 326/97; 326/95
(58) Field of Classification Search .............. 326/95–98
See application file for complete search history.

(56) References Cited

U.S. PATENT DOCUMENTS 5,764,089 A * 6/1998 Partovi et al. .............. 327/200
5,898,330 A * 4/1999 Klass ......................... 327/210
6,967,502 B2 * 11/2005 Yano ............................ 326/97

* cited by examiner

Primary Examiner—James H. Cho
(74) Attorney, Agent, or Firm—Robert R. Williams

(57) ABSTRACT

An apparatus and method provide logically controlled masking of one or more maskable data bits from a plurality of data bits that are input to a dynamic logic circuit. No masking logic and attendant delay penalty is coupled in the data path that is not needed for unmasked bits from the plurality of data bits that do not need masking. A system clock has a precharge phase and an evaluate phase. A first clock buffer is coupled to a precharge switch and precharges a dynamic node during the precharge phase. A second clock buffer having substantially the same delay from system clock input to an output of the second clock buffer is gated by a derivative of a mask. The output of the second clock buffer controls one or more switches in series with switches controlled by the maskable data bits.

14 Claims, 6 Drawing Sheets

MASKABLE DYNAMIC LOGIC

BACKGROUND OF THE INVENTION

1. Field of the Invention

The current invention generally relates to dynamic logic. More particularly, the present invention is directed to masking of certain inputs in dynamic logic.

2. Description of the Related Art

Modern electronic systems, such as digital computers frequently have a need for very fast compares of many bits. A dynamic OR is advantageously used for such compares (i.e., OR logic having a precharge phase and an evaluate phase). The dynamic OR, with suitable plus or minus phase of a number of bits to be compared, is a simple and fast structure. A dynamic OR typically has an inverting buffer, making the compare function a "NOR". It will be understood that discussion of a dynamic OR also includes a dynamic OR with an inverting buffer, providing a "NOR" function.

Often a field of data in an electronic system, such as an address, must be tested to see if that address is of interest, and such testing (comparing) must be done very quickly in order to provide fast throughput through the electronic system. For example, if a simple four-bit address is to be tested for having a value of '1000', an OR is used, with the leftmost bit being inverted. When the address value is '1000', the OR circuit drives a "0" (or, with an inverting buffer, making it a NOR circuit, a "1" is driven). The OR circuit drives a "1" (or, with an inverting buffer, a "0") is driven for all other values of the address.

Many such electronic systems require masking portions of the data presented to the dynamic OR, and incur inefficiencies and signal path delays associated with data bits that require masking. For example, at a particular time, a particular 64-bit double word might only have valid data in a first 32-bit portion of the 64-bit double word. Some bits of a second 32-bit portion of the 64-bit double word might have "1" values, although the second portion is not intended to influence the output of the dynamic OR. FIGS. 1A, 1B illustrate this situation. In FIG. 1A, bits X0–X31 are valid data to be used in the compare; bits X32–X63, at a particular time, are not to be used in the compare. At other time, all 64 bits are needed in the compare. FIG. 1B shows a conventional dynamic OR 100 that mask bits X32–X63 under control of input signal "MASK". ANDs 102A and 102B output "0" when MASK is "0", but, respectively pass data on bits X32 and X63 when MASK is "1". ANDs 102A and 102B add a stage of logic, with attendant delay, to the delay path of signals arriving from bits X32 and X63 (and similar bits in the masked portion of data input to dynamic OR 100). Dynamic OR 100 includes a clock buffer 101 that passes a system clock (system clk) as signal CLKX when an enabling signal (ACTIVATE) is active. PFET (P-channel field effect transistor) P5 precharges node 108 during a precharge phase when CLKX is low. During an evaluate phase, when CLKX is high, P5 does not conduct, and CLKX turns on NFETs (N-channel field effect transistors) N1–N4. If any of the inputs to NFETs N5-N8 (i.e., outputs of ANDs 102B, 102A, and bits X31 and X0, respectively are "1", node 108 is discharged to ground. The dots between the stacks of NFETs simply indicate that not all 32 stacks in portion 105 (i.e., masked bits X32–X63) or all 32 stacks in portion 106 (i.e., bits X0–X31) are shown. Further, ANDs 102A, 102B are just two of 32 ANDs needed to mask the 32 bits (X32–X63), with the remaining ANDs not shown, but indicated by dots between ANDs 102A and 102B. Portion 105 receives as inputs the portion of the group of bits input to the dynamic OR requiring masking; portion 106 receives as inputs the portion of the group of bits input to the dynamic OR that does not require masking.

Keeper 110 is an optional block, including inverter 111 and PFET P6, which weakly maintains node 108 at an uplevel if CLKX remains "1" for an extended period of time relative to a rate of leakage that would over time discharge node 108. PFET P6 must simply be strong enough to overcome leakage that, in time, would discharge node 108. Inverter 115 drives an output 120 of dynamic OR 100. Keeper 110 is needed if node 108 must retain a "1" (undischarged state) during an extended evaluate phase of CLKX.

Typically in such applications, a critical data path from a timing standpoint is data propagation (e.g., X0–X63 to output 120). Insertion of ANDs 102A and 102B adds delay to the critical data path of data bits X32–X63. The delay path of data bits X0–X31 do not have the added delay of blocks such as ANDs 102A and 102B.

A dynamic OR is shown as the dynamic circuit in FIG. 1B. A dynamic OR was used for exemplary purposes because of its simplicity and because of its common use. It will be understood however, that other dynamic circuits also require certain inputs to be maskable.

Therefore, there is a need for a method and apparatus that provide for masking of one or more portions of a dynamic circuit without incurring additional delay.

SUMMARY OF THE INVENTION

The current invention teaches methods and apparatus that allow masking of selected bits of data input to a dynamic circuit without incurring a delay penalty. A first clock is associated with precharging a dynamic node in the dynamic circuit during a precharge phase, and for enabling evaluation of bits that do not need masking during an evaluate phase. A second clock is associated with bits that are maskable, and allow evaluation of maskable bits during the evaluate phase, if the mask is not asserted.

An embodiment of the invention includes a dynamic logic circuit having a plurality of data inputs, one or more of the data inputs having maskable data, the dynamic logic circuit comprising: a clock block having a system clock input and a mask input, and having an output that is a first clock and a second output that is a second clock; a precharge device coupled to the first clock, the precharge device precharging a dynamic node responsive to the first clock output being in a precharge state; one or more stacks of switches, each particular stack able to discharge the dynamic node if all switches in the particular stack are conducting, each stack in the stack of switches further comprising: a first switch in each stack coupled to the second clock and being turned on by the second clock responsive to the second clock being in an evaluate state; and a second switch in each stack coupled to a particular maskable data input, the second switch being turned on by an active value on the particular maskable data input; wherein the first clock is a buffered copy of the system clock, and the second clock is a buffered copy of the system clock AND'ed with the mask.

In an embodiment of the invention, a first portion of a group of data bits (unmaskable data bits) does not require masking in the dynamic logic circuit; a second portion of the group of data bits (maskable data bits) does require masking in the dynamic logic circuit. The masking of the maskable data bits is logically controllable. A clock block transmits a first clock to a first portion of the dynamic logic circuit, causing a dynamic node in the dynamic logic circuit to be discharged if one or more unmaskable data bits are "1". The clock block transmits a second clock to a second portion of the dynamic logic circuit, the second clock being disabled under control of a mask, the second clock causing the dynamic node in the dynamic logic circuit, when the second clock is enabled, to be discharged if one or more maskable data are "1".

In a second embodiment of the invention, the group of data bits includes one or more portions that must be masked independently. The clock block produces a separate clock for each of the two or more portions that must be masked independently, each of the separate clocks pass the system clock under control of a separate mask. A clock that is not controlled by the mask is provided to a precharge device to ensure precharge of the dynamic node.

BRIEF DESCRIPTION OF THE DRAWINGS

FIG. 1A is a prior art drawing that shows an exemplary group of data bits, a portion of which must be masked in a dynamic logic circuit; a dynamic OR.

DETAILED DESCRIPTION OF THE PREFERRED EMBODIMENTS

The invention will be described in detail with reference to the figures. It will be appreciated that this description and these figures are for illustrative purposes only, and are not intended to limit the scope of the invention. In particular, various descriptions and illustrations of the applicability, use, and advantages of the invention are exemplary only, and do not define the scope of the invention. Accordingly, all questions of scope must be resolved only from claims set forth elsewhere in this disclosure.

The current invention teaches a method and apparatus to mask, under logical control, one or more maskable bits of a plurality of bits input to a dynamic logic circuit without incurring any additional delay associated with masking to a delay path through which maskable bits must propagate. A first system clock copy receives a system clock, and the first system clock copy is used to control a precharge switch that precharges a dynamic node in the dynamic logic circuit. The first system clock copy can also be used to gate discharge switches for bits not requiring masking. A second system clock copy is controlled by a mask signal. The second system clock is used to gate discharge switches for bits requiring masking. The first system clock and the second system clock have substantially the same timing relative to the system clock (when the second system clock is not inhibited by the mask signal).

For exemplary purposes, a dynamic OR (with an inverting buffer) will be used to illustrate embodiments of the invention; however it will be understood that other dynamic logic circuits enjoy the same advantages as the exemplary dynamic OR and are contemplated by the present invention.

Figure 2:
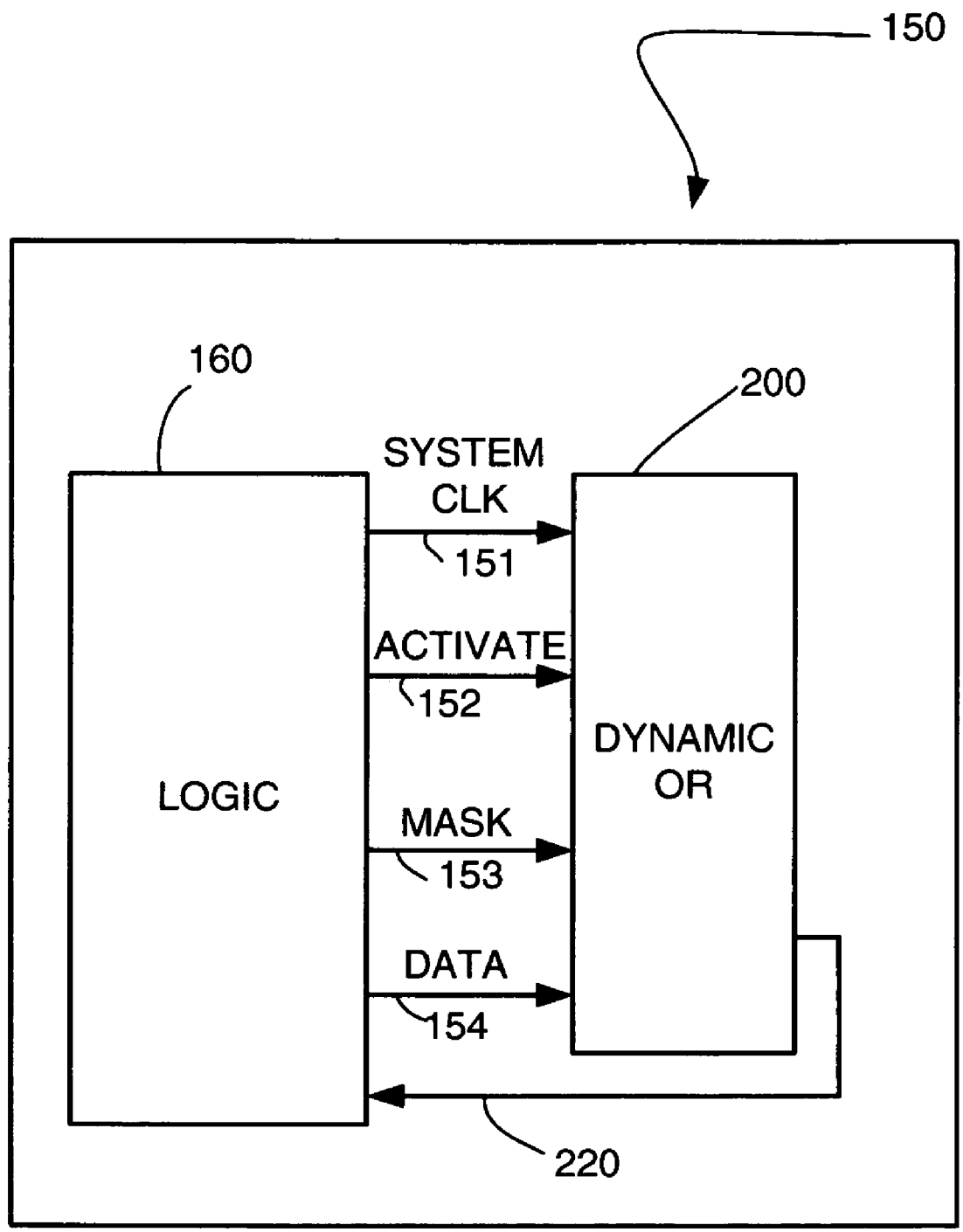
FIG. 2 shows an electronic system having a logic portion and a dynamic logic circuit.

FIG. 2 shows an electronic system 150 using an embodiment of the invention. The electronic system 150 could be a digital computer processor, a PDA (Personal Digital Assistant), or any other electronic system. Electronic system 150 includes a dynamic OR 200 according to embodiments of the invention. Electronic system also includes a logic portion 160 that produces signals driven to dynamic OR 200, including a system clock 151, an optional ACTIVATE 152 (which is supplied if the entire dynamic OR is to be disabled); and one or more MASK 153 bits used to mask one or more portions of a group data bits comprising data 154. Dynamic OR sends a signal 220 to logic portion 160. Signal 220 is the logical OR of unmaskable data bits in data 154 as well as maskable data bits in data 154 when the maskable data bits are not masked. A more complete description of the signals and data bits is found below.

Figure 3A:
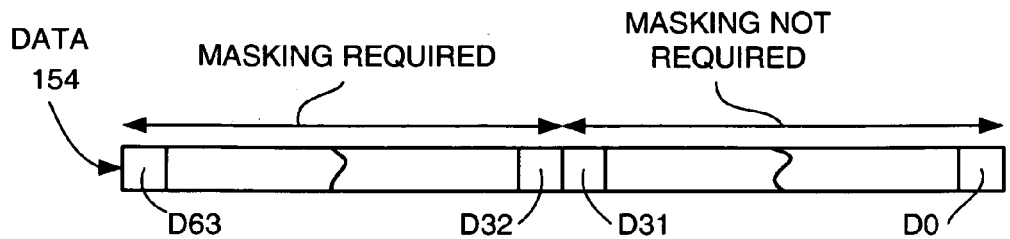
FIG. 3A shows an exemplary group of data bits, a portion of which must be masked in a dynamic circuit.

FIG. 3A shows an exemplary group of data bits comprising data 154 that is input to a dynamic OR, a portion of the data bits must be masked under logical control. Data bits needing masking are called maskable data bits; data bits not needing masking are called unmaskable data bits. For explanatory purposes, a 64-bit group of data bits for data 154 is assumed; bits D0–D31 (i.e., the low order 32 bits) do not require masking and are unmaskable data bits, and bits D32–D63 (i.e., the high order 32 bits) require masking and are called maskable data bits. It will be understood that any number of data 154 is contemplated, and that more than one portion of data 154 requiring masking is contemplated, including independent masking for different portions of data 154.

Figure 3B:
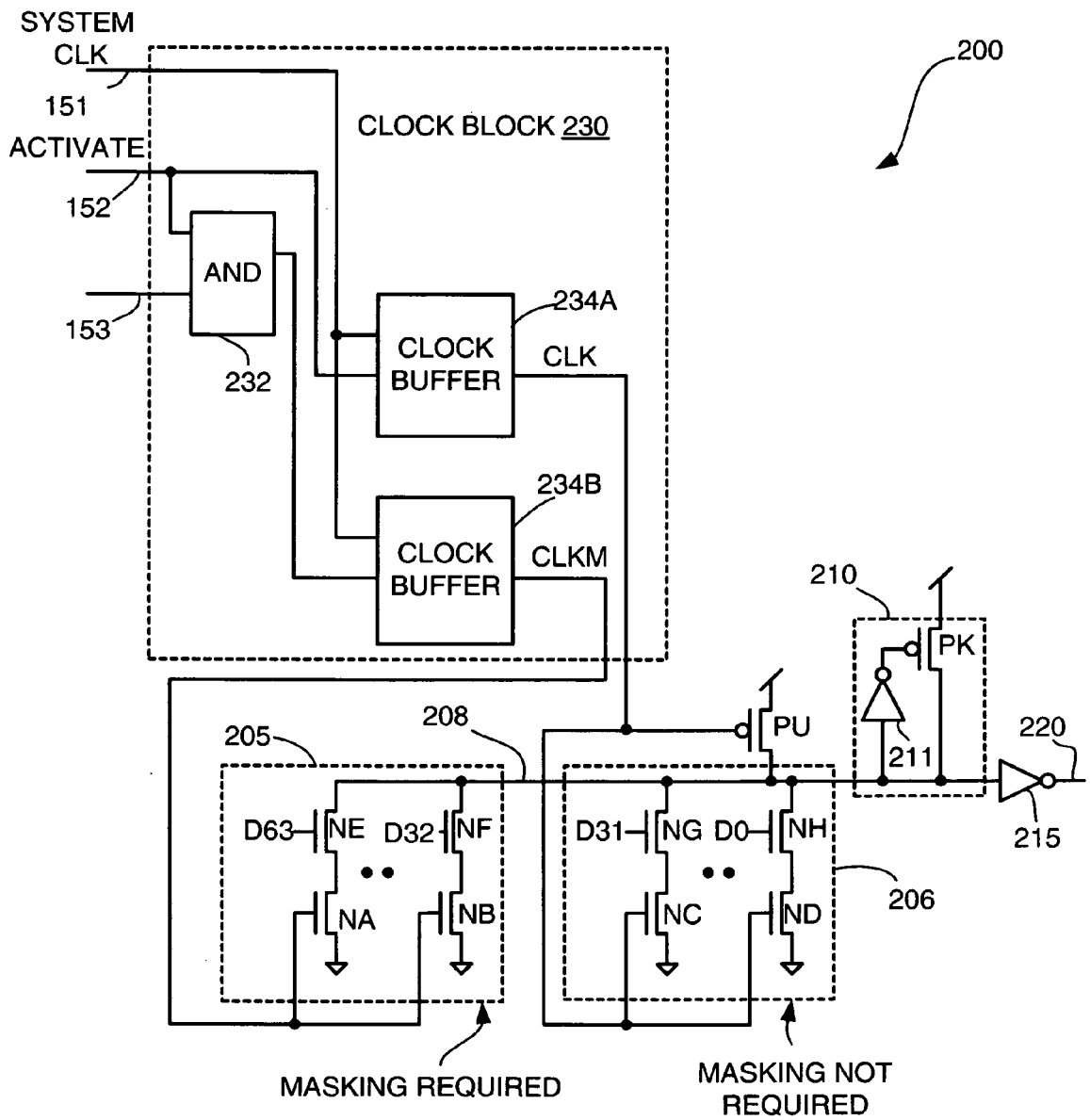
FIG. 3B shows an apparatus that masks the portion of the exemplary group of data bits in the dynamic circuit.

FIG. 3B shows a schematic embodiment of dynamic OR 200 of the invention. Data 154 is the data input to dynamic OR 200. For simplicity, only representative data bits D0, D31, D32, and D64 from data 154 are shown in FIG. 3B. A clock block 230 receives system clock 151; ACTIVATE 152; and MASK 153. In the embodiment of FIG. 3B, system clock 151 is simply an ungated clock signal. Activate 152 is active when the system clock is to actively clock dynamic OR 200. Mask 153 is asserted when the maskable data bits require masking. Mask 153 must be able to be controlled to be asserted or unasserted because the data in data 154 may be of different type at different times. For example, a computer system may be capable of using a 64-bit address or a 32-bit address. Assume that the address is contained in data 154. When comparing a 64-bit address in the dynamic OR, all 64 bits must be considered; when comparing a 32-bit address at a different time, only the lower 32 bits of the 64-bit data 154 are to be used, and MASK153 is used to disable the high order 32 bits (i.e., D32–D63) from being used in dynamic OR 200.

A first clock buffer 234A in a clock block 230 outputs CLK to a first OR portion 206 that receives unmaskable data bits D0–D31 (only D0 and D31, coupled to NFETs NH and NG, respectively, are shown), the portion of data 154 that does not require masking. CLK is produced by clock buffer 234A, which produces a "1" (evaluate phase) when system clock 151 is "1" (evaluate phase) and ACTIVATE 152 is "1". If ACTIVATE signal 152 is "1", during the evaluate phase, CLK turns on NFETs NC, ND, and similar NFETs in similar stacks indicated by the dots in portion 206. If, during the evaluate phase of CLK, any of bits D0–D31 are "1", dynamic node 208 will be discharged to ground. For example, if Bit D31 is "1", dynamic node 208 will be discharged through the series combination of NG and NC during the evaluate phase of CLK.

A second clock buffer 234B in clock block 230 outputs CLKM. CLKM is "1" when system clock 151 is "1" (evaluate phase); ACTIVATE 152 is "1" and mask 153 is "1". In the embodiment shown in FIG. 2B, clock buffers 234A and 234B are of identical design; ACTIVATE 152 and MASK153 are logically combined in AND 232 prior to inputting to clock buffer 234B. Since clock buffers 234A and 234B are of identical design, delays responsive to system clock 151 will be substantially the same (assuming like routing and loading of CLK and CLKM). Only small processing variations between the two instantiations of the identical design, as well as any slight differences in routing and/or loading cause differences in delays responsive to system clock 151.

In another embodiment (not shown) clock buffer 234B is simply a three-way AND buffer, versus the two-way AND buffer embodiment of clock buffer 234A. However, if clock buffers 234A and 234B are not identical, great care must be taken to ensure that delays through such non-identical clock buffers 234A and 234B are substantially the same. It will be understood that many Boolean equivalents are available to the designer which will produce CLK and CLKM.

Figure 3C:
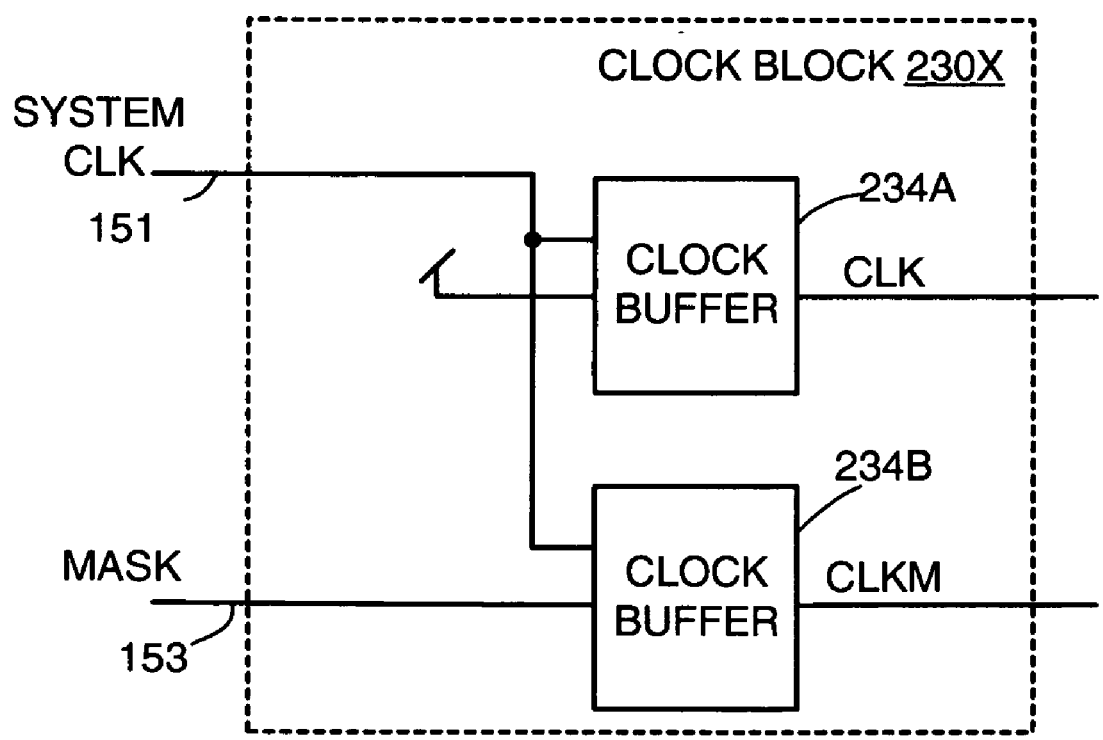
FIG. 3C shows a block diagram of a clock block for an embodiment not having an activate signal.

It will be understood that in an embodiment in which ACTIVATE 152 is not used, clock buffer 234B will receive system clock 151 and mask 153 (i.e., clock buffer 234B is a two-input logic block). An embodiment of a clock block 230, referenced as 230X in FIG. 3C, not having ACTIVATE 152 is shown in FIG. 3C. For clock buffer 234A to be identical to clock buffer 234B, clock buffer 234A must have two inputs. System clock 151 is coupled to a first input of clock 234A, and a second input of clock buffer 234A is coupled to a voltage supply having a voltage that will allow signals transmitted on signal clock 151 to pass through clock buffer 234A. Alternatively, in the embodiment not having ACTIVATE 152, the second input of clock buffer 234A can be coupled to a logic signal having a state that allows signals transmitted on signal clock 151 to pass through clock buffer 234A.

As shown previously in FIG. 3B, the 32 stacks of NFETs in portion 205 (only two stacks are shown) each have a top NFET coupled to a respective maskable data bit in data 154. For example, NFET NF is coupled to bit D32, and NFET NE is coupled to bit D63. A bottom NFET in each stack is coupled to CLKM (e.g., NFETs NA and NB). It will be understood that an alternative embodiment (not shown) of portion 205 couples the sources of NE and NF together, and provides only one NFET having a drain coupled to the sources of NE and NF; a gate coupled to CLKM; and a source coupled to ground. A similar alternative embodiment could be used for portion 206. Such alternative embodiments are logically the same as the stacks depicted in FIG. 3B, and such series paths between dynamic node 208 and ground will be considered to also be stacks. Any circuit arrangement for portion 205 or portion 206 that discharges dynamic node 208 when one or more of the maskable data inputs is "1" and CLKM is "1" (evaluate phase of CLKM), or discharges node 208 when one or more of the unmaskable data inputs is "1" and CLK is "1" is within the spirit and scope of the present invention.

Figure 1A:
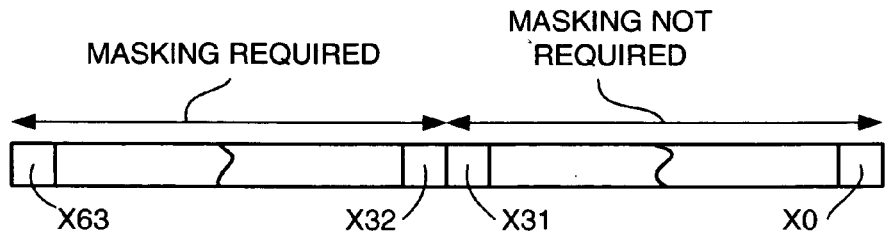
Figure 1B:
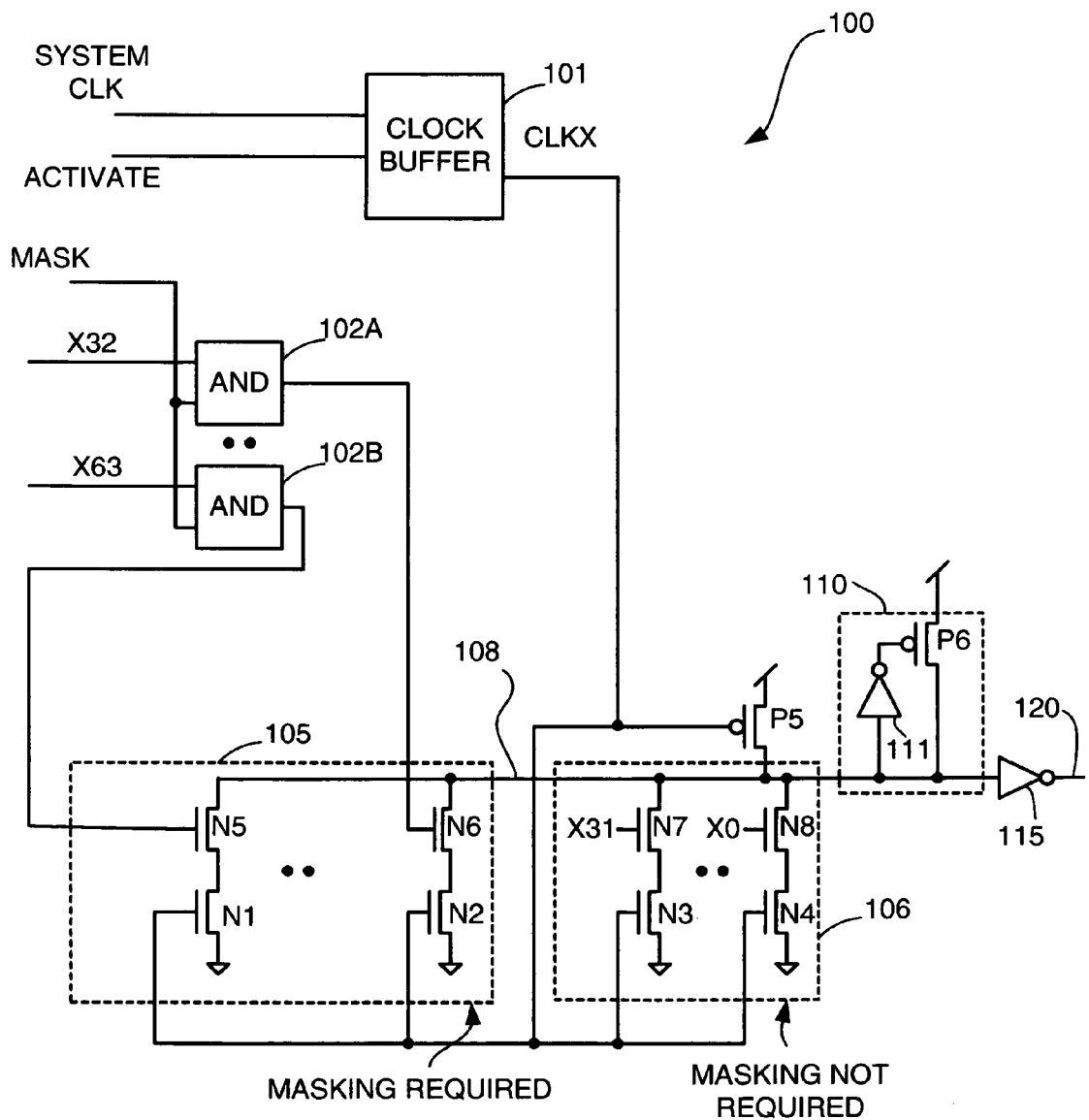
FIG. 1B shows a prior art drawing of an apparatus that provides masking of the portion of the exemplary group of data bits.

As long as MASK153 is "1", CLK and CLKM are identical (assuming that clock buffers 234A and 234B are designed identical and that wire routing of CLK and CLKM are identical, and CLK and CLKM drive the same loading) and a "1" on any of D0–D63 will cause dynamic node 208 to be discharged to ground. Activate 152, when "0", disables both CLK and CLKM. With ACTIVATE 152 active, and MASK153 at "0", CLKM will be "0", keeping NFETs NA, NB "off". Therefore, no matter what the state of D32–D63, bits in data 154 coupled to portion 205 can not discharge dynamic node 208. There is no logical series gating in a delay path of data bits D32–D63 as was the case in prior art FIG. 1B, for data bits X32–X63. Therefore, delay from a maskable data bit changing is identical to delay from an unmaskable data bit changing.

Keeper 210 is an optional keeper and includes inverter 211 and PFET PK, for the purpose of overcoming leakage on dynamic node 208 during an extended evaluate phase in which dynamic node 208 has not been discharged. Inverter 215 drives output 220 of the dynamic OR.

Figure 4A:
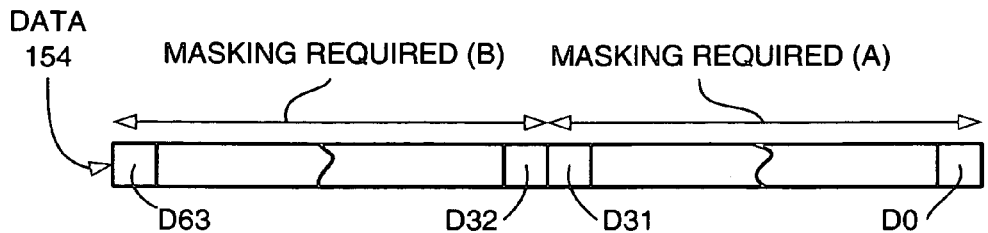
FIG. 4A shows an exemplary group of data bits having two portions which must be independently masked in the dynamic circuit.

FIG. 4A shows a data 154 that has two portions, each portion requiring masking independent from the masking of the other portion. In data 154 of FIG. 4A, maskable data bits D0–D31 require a first, "A", mask; maskable data bits D32–D63 require a second, "B", mask.

Figure 4B:
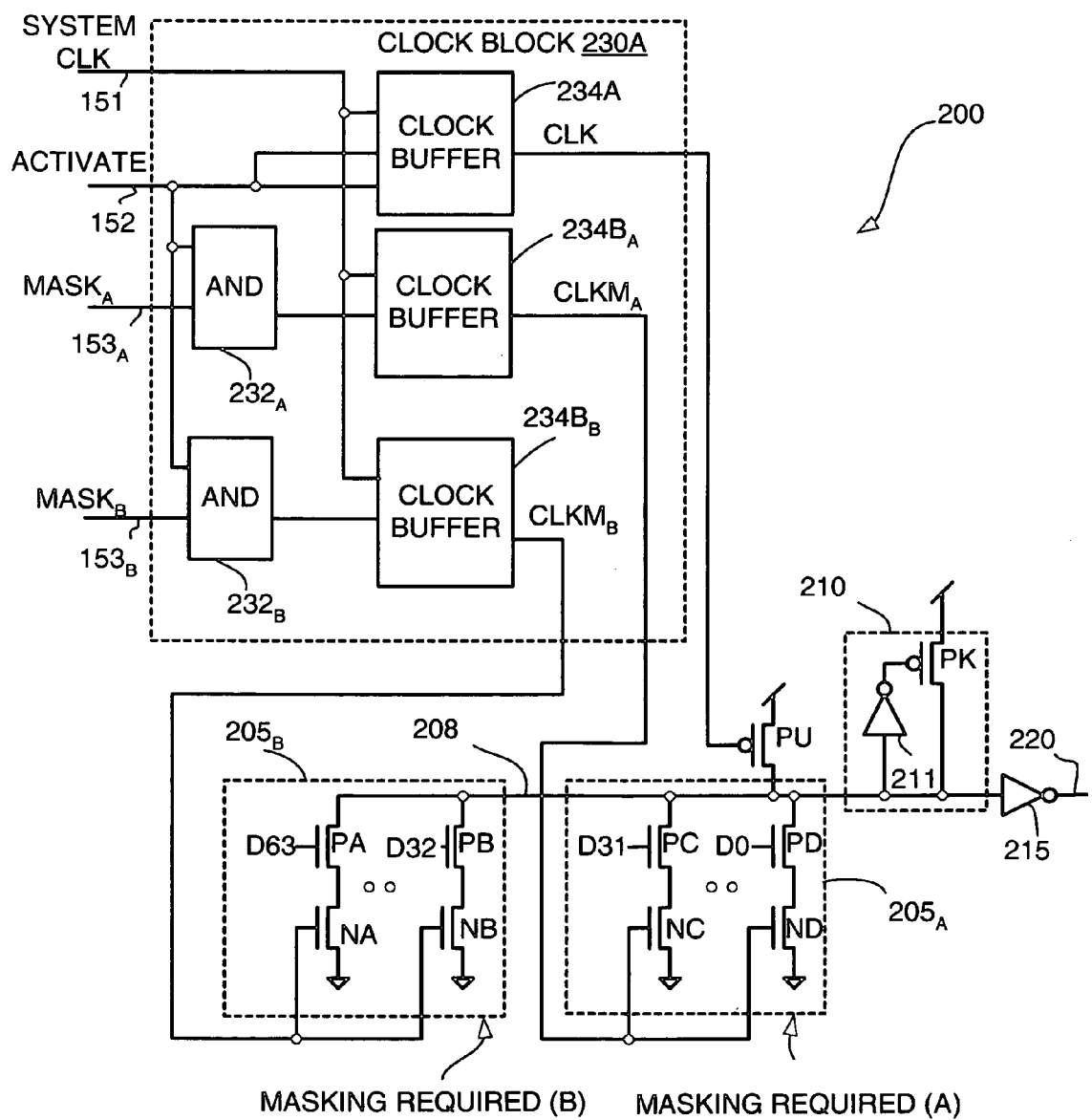
FIG. 4B shows an apparatus that independently masks the two portions of data bits shown in FIG. 4A.

FIG. 4B shows an embodiment of the invention that allows independent masking of a first portion requiring the "A" mask and masking of a second portion requiring the "B" mask as described. Data 154 as described in FIG. 4A is input to dynamic OR 200; as before, for simplicity, only bits D0, D31, D32, and D63 from data 154 are shown in FIG. 4B. Elements particular to the "A" mask will be reference numbered with a subscripted "A"; elements particular to the "B" mask will be reference numbered with a subscripted "B". Clock block 230A is similar in function to clock block 230 shown in FIG. 3B, but with additional function to accomplish the independent masking. Like named elements in FIG. 4B perform the same function as the corresponding elements in FIG. 3B.

Clock buffer 234A receives system clock 151 and ACTIVATE 152 and drives CLK as described earlier in the discussion regarding FIG. 3B. Clock buffer $234B_A$ drives $CLKM_A$ as the logical AND of system clock 151, ACTIVATE 152, and $mask_A$ $153_A$. AND $232_A$ combines ACTIVATE 152 and $mask_A$ $153_A$ in order that clock buffer $234B_A$ can be designed identical to (and therefore have the same delay as) clock buffer 234A. Similarly, clock buffer $234B_B$ drives $CLKM_B$ as the logical AND of system clock 151, ACTIVATE 152, and $mask_B$ $153_B$. AND $232_B$ combines ACTIVATE 152 and $mask_B$ $153_B$ in order that clock buffer $234B_B$ can be designed identical to (and therefore have the same delay as) clock buffer 234A. Assuming like designs of clock buffers 234A, $234B_A$ and $234B_B$, and assuming identical wire routings and loadings of CLK, $CLKM_A$ and $CLKM_B$, then waveforms and timings of CLK, $CLKM_A$ and $CLKM_B$ will be substantially the same as system clock 151 switches.

Still in reference to FIG. 4B, CLK is coupled to pullup PFET PU. CLK (i.e., an unmasked copy of system clock 151) is needed to ensure that dynamic node 208 is properly precharged. $CLKM_A$ and $CLKM_B$ are unsuitable for driving a gate of PU. When $mask_A$ or $mask_B$ is masking the first portion or the second portion of bits from data 154, $CLKM_A$ and $CLKM_B$ are held at "0" during both the precharge and the evaluate phase of system clock 151, and would keep PU turned on, even during the evaluate phase of the system clock 151. Stacks capable of discharging dynamic node 208 under control of $CLKM_A$ are shown in portion $205_A$; stacks capable of discharging dynamic node 208 under control of CLKM$_B$ are shown in portion 205$_B$. Reference numbered elements within portions 205$_A$ and 205$_B$ function as described earlier.

It will be understood that the embodiment of the invention shown in FIG. 4B is useful for any number of portions of data 154, including a single portion. For example, if all 64 bits in data 154 are to be masked, only clock buffer 234A, clock buffer 234B$_A$, and AND 232$_A$ are required in clock block 230A. All 64 bits of data 154 would be coupled to a single portion 205$_A$. Clock buffer 234A in such an embodiment, drives only PFET PU, which precharges dynamic node 208.

It will be understood that while the embodiments described above use NFETs and PFETs as switches to charge and discharge the dynamic node in the dynamic OR (e.g., dynamic node 208 in FIG. 3B), any switches that respond to clock signals and data are contemplated, for example, but not limited to, bipolar transistors).

Figure 5:
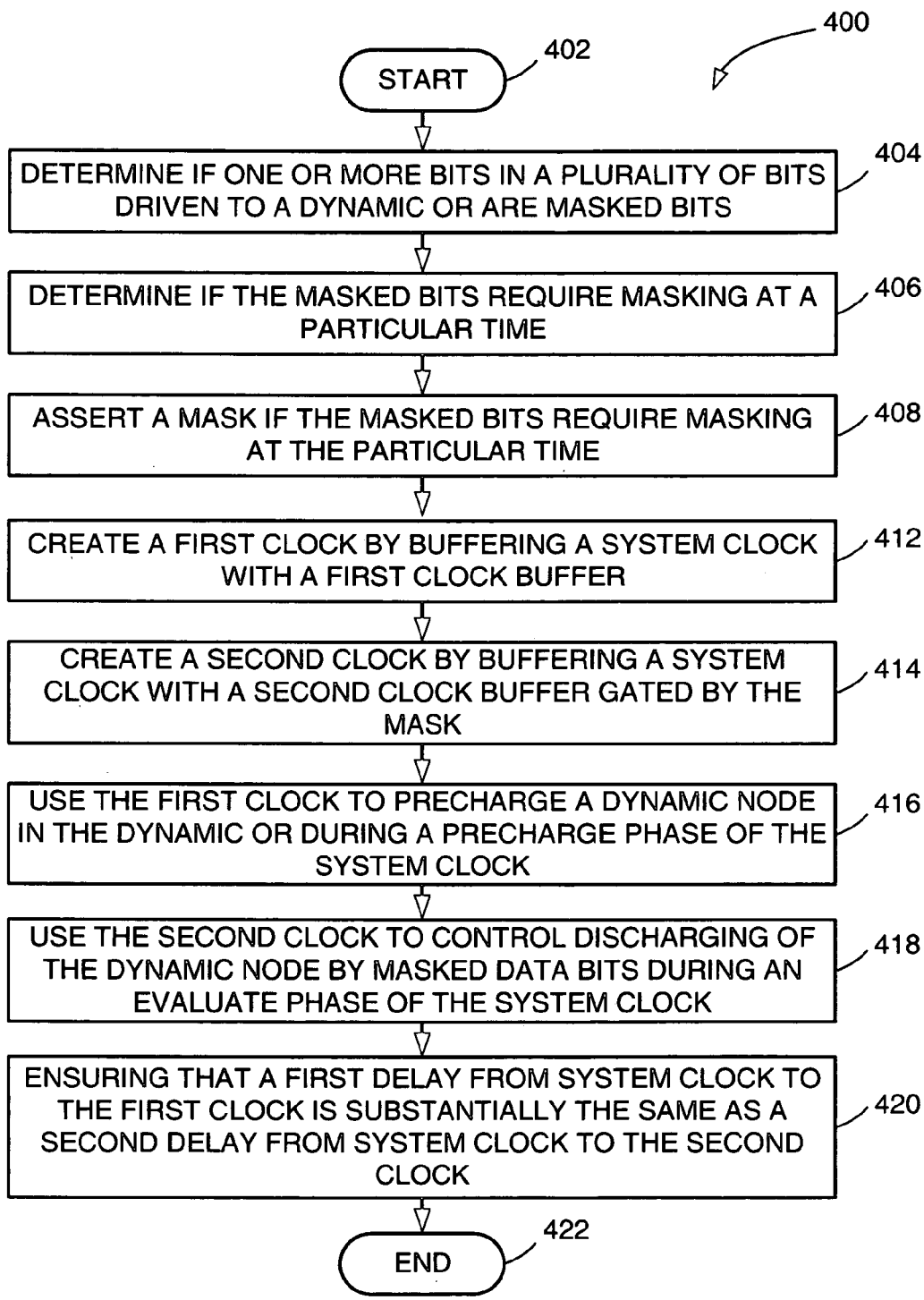
FIG. 5 is a flowchart of a method embodiment of the invention.

Embodiments of the invention can also be expressed as methods. An exemplary method 400 embodiment is shown in FIG. 5.

Method 400 begins at step 402. In step 404, a determination is made as to whether one or more data bits in a plurality of data bits coupled to a dynamic OR are masked bits, that is, bits that, at some times, require masking. For example, as described above, a computer may have to use 64-bit addresses at some times, but 32-bit addresses at other times. In such a situation, a 64-bit dynamic OR must be able to mask (ignore) the high order 32 bits in a 64-bit data input when using a 32-bit address.

Step 406 determines, at a particular time, whether the masked bits require masking at a particular time. Using the previous example, if the computer is using a 32-bit address at a particular time, the computer uses that information to determine that, at the particular time, the maskable data bits must be masked (i.e., ignored by the dynamic OR).

Step 408 asserts a mask if step 406 determines that, at the particular time, the masked bits require masking.

Step 412 creates a first clock by buffering a system clock with a first clock buffer.

Step 414 creates a second clock by a clock buffer that is coupled to the system clock and a derivative of the mask. For example, if an activate is used (e.g., ACTIVATE 152 in FIG. 2), the mask is AND'ed with the activate to produce the derivative of the mask. If, in an implementation, the activate is not used, the mask derivation is simply the mask itself.

Step 416 uses the first clock to precharge a dynamic node (e.g., dynamic node 208 shown in FIG. 3B) during a precharge phase of the system clock. Dynamic logic circuits uses a precharge clock to control a switch to precharge a dynamic node, the dynamic node will then maintain the precharged voltage for some period of time, the period of time dependant on amount of leakage and an amount of capacitance on the precharged node. Dynamic logic circuits have an evaluation phase where one or more switches that are controlled by data inputs can discharge the dynamic node. The first clock can be used to control one or more switches in series with each of the switches that are controlled by unmaskable data inputs.

In step 418, the second clock is used to control discharging of the dynamic node by maskable data bits during the evaluate phase of the system clock. An apparatus to perform this step is shown in FIG. 3B, reference numeral 205. If MASK 153 (FIG. 3B) is "0", clock buffer 234B (FIG. 3B) produces a "0" on CLKM, which causes switches NA and NB (shown as NFETs) to be off.

In step 420, design of circuitry that produces the first clock and the second clock ensures that a first delay from the system clock to the first clock is substantially the same as a second delay from the system clock to the second clock. Advantageously this is accomplished by using an identical design for the circuitry (e.g., clock buffer 234A and clock buffer 234B shown in FIG. 3B).

Step 422 completes the method.

What is claimed is:

1. A dynamic logic circuit having a plurality of data inputs, one or more of the data inputs are maskable data, comprising:
   a clock block having a system clock input that receives a system clock, a mask input that receives a mask, a first clock output that drives a first clock, and a second clock output that drives a second clock;
   a precharge device coupled to the first clock output, the precharge device precharging a dynamic node responsive to the first clock being in a precharge state;
   one or more stacks of switches, each particular stack able to discharge the dynamic node if all switches in the particular stack are conducting, each stack in the stack of switches further comprising:
   a first switch in each stack coupled to the second clock output and being turned on by the second clock responsive to the second clock being in an evaluate state; and
   a second switch in each stack coupled to a particular maskable data input, the second switch being turned on by an active value on the particular maskable data input;
   wherein the first clock is a buffered copy of the system clock, and the second clock is a logical derivative of the system clock and the mask.

2. The dynamic logic circuit of claim 1, the clock block further comprising:
   a first clock buffer having the system clock as a first input and driving the first clock as an output; and
   a second clock buffer having the system clock as a first input; a logical derivative of the mask as a second input and the second clock as an output, the second clock buffer having a delay from the system clock input to the second clock output substantially the same as a delay from the system clock input of the first clock buffer to the first clock output.

3. The dynamic logic circuit of claim 2, the first clock buffer further comprising a second input coupled to a voltage that enables the system clock to propagate through the first clock buffer.

4. The dynamic logic circuit of claim 2, the first clock buffer further comprising a second input coupled to an activate signal, that, when active, enables the system clock to propagate through the first clock buffer, but when the activate signal is inactive, prevents the system clock from propagating through the first clock buffer.

5. The dynamic logic circuit of claim 4, further comprising a logic block that combines the activate signal and the mask to produce the logical derivative of the mask.

6. The dynamic logic circuit of claim 5, wherein the first clock buffer and the second clock buffer are of identical design.

7. The dynamic logic circuit of claim 1, further comprising:
   one or more unmaskable data inputs in the plurality of data inputs that do not need masking in the plurality of inputs;
   one or more unmasked stacks of switches, each particular unmasked stack able to discharge the dynamic node if all switches in the particular unmasked stack are conducting, each unmasked stack in the one or more unmasked stacks further comprising:
a first unmasked switch coupled to the first clock and being turned on responsive to the first clock being in an evaluate state; and
a second unmasked switch coupled to a particular unmaskable data input, the second unmasked switch turned on responsive to an active value on the particular unmaskable data input.

8. The dynamic logic circuit of claim 1, further comprising a keeper coupled to the dynamic node, the keeper capable of holding the dynamic node at the precharged voltage during an extended evaluate phase when none of the stacks discharges the dynamic node.

9. The dynamic logic circuit of claim 8, the keeper further comprising:
an inverter having an input coupled to the dynamic node; and
a weak FET having a gate coupled to an output of the inverter, a source coupled to a voltage supply, and a drain coupled to the dynamic node.

10. An electronic system comprising:
a logic portion that outputs a system clock, a plurality of data bits, and a mask that is asserted when one or more maskable data bits in the group of data bits is to be masked;
a dynamic logic circuit having a plurality of data inputs coupled to the plurality of data bits, comprising:
a clock block having a clock input coupled to the system clock that receives the system clock, a mask input that receives the mask, a first clock output that drives a first clock, and a second clock output that drives a second clock;
a precharge device coupled to the first clock, the precharge device precharging a dynamic node responsive to the first clock output being in a precharge state;
one or more stacks of switches, each particular stack able to discharge the dynamic node if all switches in the particular stack are conducting, each stack in the stack of switches further comprising:
a first switch in each stack coupled to the second clock and being turned on by the second clock responsive to the second clock being in an evaluate state; and
a second switch in each stack coupled to a particular maskable data input, the second switch being turned on by an active value on the particular maskable data input;
wherein the first clock is a buffered copy of the system clock, and the second clock is a logical derivative of the system clock and the mask.

11. The electronic system of claim 8, the dynamic logic circuit further comprising:
one or more unmaskable data inputs in the plurality of data inputs that do not need masking in the plurality of inputs;
one or more unmasked stacks of switches, each particular unmasked stack able to discharge the dynamic node if all switches in the particular unmasked stack are conducting, each unmasked stack in the one or more unmasked stacks further comprising:
a first unmasked switch coupled to the first clock and being turned on responsive to the first clock being in an evaluate state; and
a second unmasked switch coupled to a particular unmaskable data input, the second unmasked switch turned on responsive to an active value on the particular unmaskable data input.

12. A method for masking one or more maskable data bits in a plurality of data bits input to a dynamic logic circuit comprising the steps of:
providing a system clock having a precharge phase and an evaluate phase determining which data bits in the plurality of data bits are maskable data bits;
determining, at a particular time, if the maskable data bits require assertion of a mask;
if asserting the mask is required at the particular time, asserting the mask;
creating a first clock by buffering the system clock with a first clock buffer, the first clock having a precharge phase and an evaluate phase responsive to the precharge phase and the evaluate phase of the system clock;
creating a second clock with a second clock buffer responsive to gating by a derivative of the mask, the second clock having an evaluate phase responsive to the evaluate phase of the system clock unless inhibited by the mask;
using the first clock to precharge a dynamic node in the dynamic logic circuit during the precharge phase of the first clock;
using the second clock to control discharge of the dynamic node by maskable data bits during the evaluate phase of the second clock; and
ensuring that a first delay from the system clock to the first clock is substantially the same as a second delay from the system clock to the second clock.

13. The method of claim 12, the step of ensuring that the first delay is substantially the same as the second delay further comprising the step of making the first clock buffer and the second clock buffer of identical design.

14. An electronic system having a dynamic logic circuit having a data input and a mask input and a first clock input not associated with the mask input and a second clock associated with the mask input, wherein the second clock causes a first data bit in the data input to be not considered in a function of the dynamic logic circuit and wherein the first clock causes the logic function of the dynamic logic circuit to be performed on a second data bit in the data input;
a mask signal source for providing a mask to the mask input;
a data signal source for providing data to the data input;
a first clock buffer circuit for driving a system clock to the first clock input; and
a second clock buffer circuit for logically combining the mask and the system clock to drive a first clock signal to the first clock input, a delay through the first clock buffer circuit being substantially the equal to a delay through the second clock buffer circuit.

* * * * *